(12) United States Patent
Hurwitz et al.

(10) Patent No.: US 10,132,846 B2
(45) Date of Patent: Nov. 20, 2018

(54) METHOD OF AND APPARATUS FOR LEARNING THE PHASE ERROR OR TIMING DELAYS WITHIN A CURRENT TRANSDUCER AND POWER MEASUREMENT APPARATUS INCLUDING CURRENT TRANSDUCER ERROR CORRECTION

(71) Applicant: Analog Devices Global, Hamilton (BM)

(72) Inventors: Jonathan Ephraim David Hurwitz, Edinburgh (GB); Seyed Amir Ali Danesh, Edinburgh (GB); William Michael James Holland, Edinburgh (GB); Shaoli Ye, Woburn, MA (US)

(73) Assignee: Analog Devices Global, Hamilton (BM)

( * ) Notice: Subject to any disclaimer, the term of this patent is extended or adjusted under 35 U.S.C. 154(b) by 160 days.

(21) Appl. No.: 15/182,094

(22) Filed: Jun. 14, 2016

(65) Prior Publication Data
US 2017/0356939 A1 Dec. 14, 2017

(51) Int. Cl.
*G01R 25/00* (2006.01)
*G01R 21/133* (2006.01)
(Continued)

(52) U.S. Cl.
CPC ......... *G01R 25/00* (2013.01); *G01R 19/2513* (2013.01); *G01R 21/06* (2013.01);
(Continued)

(58) Field of Classification Search
CPC ...... G01R 25/00; G01R 25/005; G01R 25/04; G01R 19/00; G01R 19/0084;
(Continued)

(56) References Cited

U.S. PATENT DOCUMENTS

| 6,456,097 B1 | 9/2002 | Sutherland |
| 2002/0024269 A1* | 2/2002 | Nakatsuka ............ H01L 41/044 310/318 |

(Continued)

FOREIGN PATENT DOCUMENTS

| DE | 2406114 B1 | 7/1975 |
| WO | WO-2013038176 A2 | 3/2013 |

(Continued)

OTHER PUBLICATIONS

"Current Transformers, An Analysis of Ratio and Phase Angle Errror", © 2001 CR Magnetics, Inc., (2001), 1-7.
(Continued)

*Primary Examiner* — Hoai-An D Nguyen
(74) *Attorney, Agent, or Firm* — Schwegman Lundberg & Woessner, P.A.

(57) ABSTRACT

Current transducers are widely used in current measuring systems. They provide good isolation between the supply voltage and the measurement equipment. However they can introduce small phase errors which can become significant sources of error if the current to a load is out of phase with the supply voltage for the load. This disclosure discusses a robust measurement apparatus and method that can be used in situ to monitor for and correct phase errors.

36 Claims, 15 Drawing Sheets

(51) Int. Cl.
*G01R 19/25* (2006.01)
*G01R 21/06* (2006.01)
*G01R 22/10* (2006.01)
*G01R 19/00* (2006.01)

(52) U.S. Cl.
CPC .......... *G01R 21/133* (2013.01); *G01R 22/10* (2013.01); *G01R 25/005* (2013.01); *G01R 19/0092* (2013.01); *G01R 19/25* (2013.01)

(58) Field of Classification Search
CPC ............... G01R 19/0092; G01R 19/25; G01R 19/2513; G01R 21/00; G01R 21/06; G01R 21/133; G01R 22/00; G01R 22/06; G01R 22/10; G01R 23/00; G01R 23/005; G01R 23/20; G01R 13/00; G01R 11/19; G01N 29/075; G01P 3/565; H02H 3/302; H02H 3/353; H02H 3/382
USPC ...... 324/76.11, 76.39, 76.52, 76.77, 86, 137, 324/138, 600, 612, 620, 622; 702/1, 57, 702/66, 71, 72, 85, 106
See application file for complete search history.

(56) References Cited

U.S. PATENT DOCUMENTS

| | | | |
|---|---|---|---|
| 2003/0042886 A1 | 3/2003 | Gandhi | |
| 2004/0183522 A1 | 9/2004 | Gunn et al. | |
| 2005/0267696 A1* | 12/2005 | Yamaguchi | G01R 29/02 702/57 |
| 2006/0129339 A1 | 6/2006 | Bruno | |
| 2007/0279041 A1 | 12/2007 | Fritz et al. | |
| 2010/0207604 A1 | 8/2010 | Bitsch et al. | |
| 2011/0320146 A1* | 12/2011 | Watanabe | G01R 31/1227 702/65 |
| 2013/0003891 A1* | 1/2013 | Premakanthan | H04L 27/364 375/296 |
| 2013/0278917 A1* | 10/2013 | Korekado | G01C 3/08 356/5.01 |
| 2014/0236533 A1* | 8/2014 | Drachnnann | G01F 1/667 702/176 |
| 2015/0188553 A1* | 7/2015 | Familia | H03L 7/097 327/5 |
| 2015/0207476 A1* | 7/2015 | Kohama | H03F 1/02 330/278 |

FOREIGN PATENT DOCUMENTS

WO  WO-2014072733 A2  5/2014
WO  WO-2017216598 A1  12/2017

OTHER PUBLICATIONS

"Understanding AC Power Source Measurements", Application Note #106, © 1998, California Instruments Corp., (1998), 4 pgs.

Mlejnek, P., et al., "Calibrations of phase and ratio errors of current and voltage channels of energy meter". *Sensors & their Applications XVII, Journal of Physics Conference Series*, 450, 012046, (2013), 1-5.

"International Application Serial No. PCT/IB2016/001992, International Search Report dated Apr. 5, 2017", 7 pgs.

"International Application Serial No. PC1782016/001992, Written Opinion dated Apr. 5, 2017", 7 pgs.

Cataliotti, Antonio, et al., "Current Transformers Effects on the Measurement of Harmonic Active Power in LV and MV Networks", *IEEE Transactions on Power Delivery*, 26(1), (2011), 360-368.

Jonetzko, Roman, et al., "High frequency non-intrusive electric device detection and diagnosis", *International Conference on Smart Cities and Green ICT Systems*, (2015), 8 pgs.

Locci, Nicola, et al,, "Hysteresis and Eddy Currents Compensation in Current Transformers", *IEEE Transactions on Power Delivery*, 16(2), (2001), 154-159.

Petrovic, P, et al., "New Digital Multimeter for Accurate Measurement of Synchronously Sampled AC Signals", *IEEE Transactions on Instrumentation and Measurement*, 53(3), (Jun. 2004), 716-725.

Qifeng, Xu, et al., "A new method to compensate current transformer using microprocessors", Proceedings, *1991 International Conference on Advances in Power System Control, Operation & Management*, (1991), 355-358.

Waltrip, Bryan C, et al., "AC Power Standard Using a Programmable Josephson Voltage Standard", *IEEE Transactions on Instrumentation and Measurement*, 58(4), (Apr. 2009), 1041-1048.

Wang, Peng, et al., "A calibration method for power metering system with electronic instrument transformers", *2012 3rd IEEE PES Innovative Smart Grid Technologies Europe (ISGT Europe)*, Berlin, (2012), 1-5.

Zheng, Tai-Ying, et al., "Development of a compensating algorithm for an iron-cored measurement current transformer", *2009 IEEE Bucharest Power Tech Conference*, Jun. 28-Jul. 2, Bucharest, Romania, (2009), 1-6.

\* cited by examiner

METHOD OF AND APPARATUS FOR LEARNING THE PHASE ERROR OR TIMING DELAYS WITHIN A CURRENT TRANSDUCER AND POWER MEASUREMENT APPARATUS INCLUDING CURRENT TRANSDUCER ERROR CORRECTION

FIELD

The present disclosure relates to methods of and apparatus for estimating a phase shift occurring within a current transducer, such as a current transformer, and to power measurement systems including such an apparatus. Such a phase shift from the transducer can be regarded as being a phase measurement error. The teachings of the present disclosure can also be used to assess delays and phase shifts resulting from signal processing chains.

BACKGROUND

There is often a desire to know the current being supplied to "a user" of the current, where the user might be a factory, a distribution circuit within a factory or a dwelling, or one or more devices. It is often also highly desired to know the actual amount of energy being used by "the user" such that a power supply company can charge the user for the amount of energy that they use.

The power consumed by a device supplied with a sinusoidal voltage and drawing a sinusoidal current can be calculated from $$P = V * I * \cos\theta \qquad \text{eqn 1}$$

Where:
V is the voltage,
I is the load current and
θ is the phase angle between the voltage waveform applied to the device and the current flowing in the device. Cos θ is known as the power factor.

As is known to the person skilled in the art, the angle θ represents the phase difference between the applied voltage waveform and the resulting current as a result of inductive or capacitive loads being fed by the power line. In a simple case both are assumed to be sinusoids at the mains frequency. In such a simple system then it is relatively easy to work in terms of phase shifts. However in reality a load, such as a motor, a switched mode supply or an inverter may have a complex current draw that includes components at multiples of the mains frequency and/or a switching frequency within the load.

Furthermore, regulatory authorities often require that consumers are fairly treated by their energy providers, and hence strict tolerance limits are imposed on the accuracy of power (watt-hour) meters. Therefore it is important that such meters maintain high levels of accuracy under all expected operating conditions. This means that the mains voltage needs to be measured, the mains current needs to be measured, and that any phase difference between the mains voltage and the mains current measurements needs to be accounted for, with sufficient accuracy such that the estimate of power consumed by a load falls within the specified levels of accuracy.

The transducers may introduce errors. For example the current transducer, such as a current transformer, may introduce an error in the size of the measured current. It may also introduce a phase error in the estimate of phase between the voltage and the current, both of which can be represented on a phasor diagram. These errors may impact adversely on the accuracy of estimates of power being consumed by a load. Similarly filters, for example filters used to reject glitches, can introduce a delay in the current and voltage processing signal paths. Furthermore although the average delay though the filters for a batch of products such as power meters may be known to reasonable accuracy on a statistical basis component to component manufacturing variation may mean that the absolute delay or indeed frequency response of any given filter is not known.

It is desirable to be able to estimate the phase error introduced by a current transducer, and/or other signal processing components within a signal processing chain involved in the measurement of voltage and current within a watt-hour meter.

SUMMARY

According to the first aspect of this disclosure there is provided a method of estimating phase measurement errors in measurements of a quantity to be measured (known as a "measurand"), such as current or voltage. The method comprises providing an input signal to an input of a processing chain that acts on the measurand. For example, if it is desired to measure current then the input signal is applied to a current transducer. The input signal is not sinusoidal.

The input signal may be a repeating signal. The repeating signal preferably, but not necessarily, has nominally linear rising and falling edges. This makes it relatively easy to produce. For example the repeating signal can be produced by an inexpensive square wave generator or by a relatively low cost and low precision digital to analog converter. An output signal from the signal processing path, for example from the current transducer, is analyzed to determine the phase measurement error. The analysis may comprise correlating the input and output signals to determine a propagation delay and from that a phase error.

The method further comprises applying a correction to the estimate of phase measurement error to account for a finite rate of change of the edges of the input signal, or non-linearities in the input signal.

The phase measurement error can then be used by a power meter to improve the accuracy of a power estimate.

It is highly desirable that the method of measuring phase errors be relatively simple, and not burdensome in terms of computation required or measurement equipment required such that an apparatus implementing the method can be included within equipment, such as a watt hour meter without incurring an excessive cost burden. Preferably the measurement of error is repeated such that the apparatus is responsive to changes in the phase measurement error introduced by the current transformer, for example as a result of temperature change effecting the resistance of windings of the current transformer or the magnetic properties of the core, such as, changes in permeability (which is a complex variable) of the core with frequency and magnitude of the magnetic field generated by the current being measured and/or from stray magnetic fields. The measurement of error can be repeated according to a measurement schedule or performed continuously.

One significant potential cost burden is the apparatus required to generate the input signal. Signal generators capable of producing high quality sinusoidal signals tend to be relatively expensive devices. For a mass produced product which operates in a cost competitive environment the use of such expensive signal generators is effectively prohibited on economic grounds. It is therefore desirable to find a way of using cheaper signal generators without sacrificing measurement performance.

In accordance with the teachings of the present disclosure a high quality sinusoidal input signal is not required. The input signal may be generated by digital electronics or have a digital like form. In the simplest form the input signal may transition between first and second levels in a predictable pattern. Such a signal may be a square wave or at least square wave like. The signal need not have a 50-50 mark space ratio. Square wave generators are much less expensive to implement than other forms of signal generator. However, even for a square wave generator there are practical considerations which materially affect its cost of implementation. An ideal square wave transitions instantaneously between a high voltage or high current state and a low voltage or low current state, or more generally between first and second states.

However real world drive circuits exhibit finite rates of voltage change or current change, either because they are bandwidth limited or because they are slew rate limited in operation. The square wave generator may also suffer from overshoot or undershoot and may have an asymmetric output waveform. The inventors realized that a method for determining a phase measurement error needed to take account of slew rate or bandwidth limited transitions or other non-ideal artefacts in the drive signal. Once the error is determined, then steps can be taken to correct it or otherwise mitigate its effects.

This realization allows non-ideal versions of square wave like signals to be tolerated or indeed deliberately adopted for ease of characterization and implementation. For example signals where transitions are defined by exponential functions may be chosen. Such functions are found when charging or discharging a capacitor via a resistor, and are inexpensive to implement and due to the simplicity of the components used have a reliable waveform.

The input waveform may be generated by a digital to analog converter, DAC. This allows discrete/step like approximations of waveforms of any desired shape to be produced. Such waveforms may approximate sinusoids, triangle waves, square waves or non-regular shapes. The shapes may be modified to ease the burden on drive amplifiers or to modify the frequency spectrum of the drive signal to reduce the risk of interference. Alternatively the DAC may be driven by a random or pseudorandom input sequence such that the drive signal looks like noise. However auto correlation techniques can be used to identify the input signal and estimate the time delay that is undergoes as it propagates though the signal processing chain. The input signal may be subjected to filtering in the analog or digital domains if delay as a function of frequency is to be analyzed and characterized.

In an extension of this technique a less defined source may be used to generate the input signal or a naturally occurring signal on a current carrying conductor may be used in place of the signal generator and may be digitized by an analog to digital converter, which may bypass the anti-alias filter, so as to acquire the noise signals and the correlate the output signal with the input signal to estimate the propagation delay and/or phase error introduced by a transducer or a signal processing path. Alternatively if the glitch filters are common to all signal paths (and well matched for example because they are formed on the same silicon die inside an integrated circuit) then the absolute delay introduced by the filter does not need to be known as it cancels out in the power calculations, in which case the ADC can work with a filtered signal.

The present disclosure is not limited to the use of two level digital signals. Other non-sinusoidal signals may be used. Indeed the rising and falling edges According to a second aspect of the present disclosure there is provided an apparatus for performing the method of the first aspect. The apparatus comprises a signal generator for generating an input signal, such as a repeating input signal having a fundamental frequency. The input signal being used to modulate a measurand, such as a current, being measured by a transducer, such as a current transformer, and where the repeating signal is not sinusoidal, or at least not a high quality sinusoid. The apparatus further comprises a signal processing circuit for receiving an output signal from the transducer and analyzing the output signal to determine a phase difference compared to the input signal, wherein the apparatus further comprises a circuit for applying a phase correction to compensate for errors, such as slew rate limiting or charging/discharging artefacts in the input signal.

The apparatus may be included within a power meter which is used to estimate the amount of energy consumed from or transferred to an electricity distribution system.

The apparatus and method may also be used during manufacture of a transducer or watt-hour meter to characterize the transducer or calibrate the meter. In the case of a meter, the calibration values may be stored in memory within the meter. The meter may further include a communications device (which may be wired or wireless) to send data such as the power that has been consumed and the estimate of phase measurement error to a remote party, such as a power supplier. This enables health checking of the meter to be performed, as drift or degradation can be monitored. It may also provide information concerning attempts to tamper with the current measurement circuit.

BRIEF DESCRIPTION OF THE DRAWINGS

Embodiments of the present disclosure will now be described, by way of non-limiting example only, with reference to the accompanying Figures, in which.

DESCRIPTION OF SOME EMBODIMENTS OF THE DISCLOSURE

It is often desirable to measure electrical parameters, such as voltage supplied to a load and/or current supplied to a load. In order to provide a more accurate assessment of power drawn, based on actual voltage and current as opposed to assuming a nominal voltage and a sinusoidal load current, it is becoming known to use digital meters.

Figure 1:
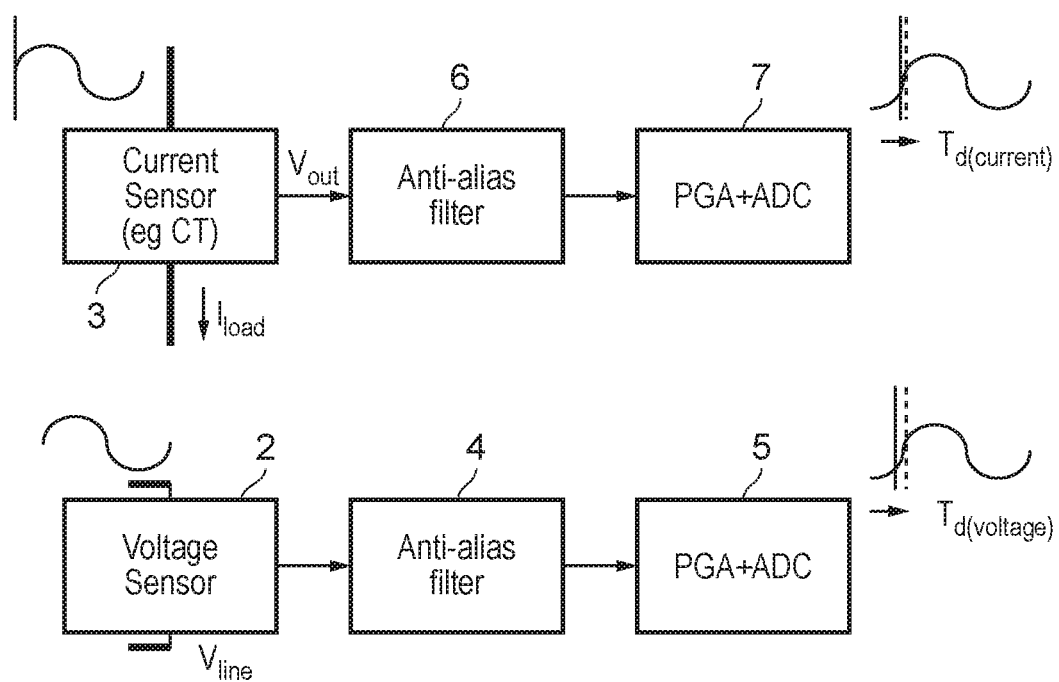
FIG. 1 schematically illustrates the data acquisition channels of an electronic watt-hour meter.

FIG. 1 shows, in schematic form, the major components in the data acquisition channels for a digital power meter. Power from a power supply such as a mains supply is provided to a load. The load may be a single phase load or a multiple phase load. For the or each phase, the load voltage is measured by a suitable voltage sensor 2 and the line current for the or each phase is measured by a suitable current sensor 3.

The output from the voltage sensor 2 (or sensors in a multiphase system) may be passed through a filter 4 to limit the signal bandwidth to an appropriate range, for example to avoid aliasing, and then to an analog to digital converter 5. The analog to digital converter (ADC) may be associated with a programmable gain amplifier. Similarly the output from the or each current sensor 3 may be passed through a suitable filter 6 and the digitized by an ADC 7 which may be associated with a programmable gain amplifier.

The voltage sensor is often a potential divider so the response of the potential divider should be rapid, i.e. it does not introduce a processing delay or phase error. The anti-alias filter will introduce a phase delay, and although this should be well determined, tolerances during manufacture mean that its delay is unlikely to be precisely known as its cut-off frequency will only be approximately known. The ADC will also introduce a delay, but as this is a digital component its performance is determined by system clocks.

For the current measurement channel similar comments to those above apply to the filter 6 and ADC 7. However, the current measurement sensor may introduce a further phase error/delay depending on the current measurement technology used. Shunt resistors introduce no phase delay, but have the disadvantages of having to be placed into the supply path. On the other hand current transformers can be placed around a conductor in situ and have excellent isolation properties. They do however introduce phase delays.

Figure 2:
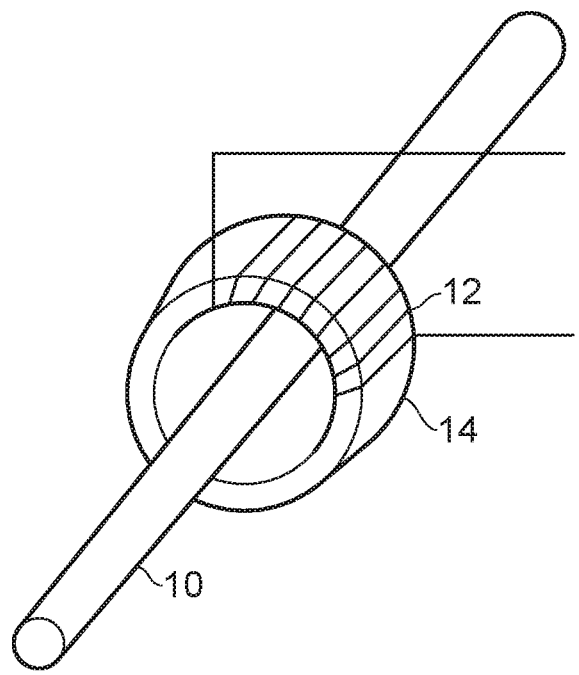
FIG. 2 schematically illustrates a current transformer.

In order to set the present invention in context, it is useful to consider the operation of a current transformer. FIG. 2 schematically illustrates the components of a current transformer. In essence, a conductor 10 carrying an alternating current to be measured acts as the primary winding of the current transformer. A secondary winding 12 is magnetically coupled to the primary winding 10. The secondary winding 12 may be wound around the primary winding 10 or may be wound around a core 14 which magnetically couples to the primary winding 10. By their very nature, current transformers provide good isolation between the conductor 10 and the secondary winding 12. They also exhibit minimal influence on the conductor 10 and if the core 14 can be split, then the current transformer can be inserted around the primary conductor 10 without disrupting it.

Figure 3:
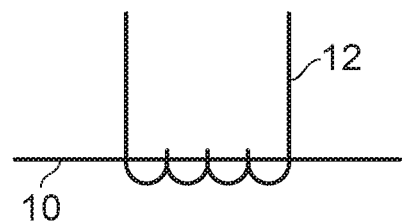
FIG. 3 shows the circuit diagram representation of the device shown in FIG. 2.

The effective turns ratio between the primary and secondary is normally specified by the ratio of current flowing through the primary to the current output by the secondary. A transformer having a ratio of 1000 to 1 would output 1 amp from the secondary for every 1000 amps flowing through the primary. The transformers may be tapped to allow the measurement circuitry following the transformer to operate over a larger current range. A physical device shown in FIG. 2 can be represented by the circuit diagram of FIG. 3.

As noted earlier, a consumer needs to be accurately charged for the amount of power they use. Overcharging is not acceptable to regulating authorities and undercharging represents a potentially large loss of revenue. One significant problem is that the effect of even small phase errors can lead to large errors in the measurement of the amount of power consumed.

As noted earlier, the power consumed is a function not only of the voltage and the current, but also of the phase θ between the voltage and the current.

It is known that due to the inductance and resistance within the current transformer, the current transformer itself introduces a phase error. Thus the measured power may be represented as $P_{meas}$ where $$P_{meas}=V*(I*K_i)*\cos(\theta+\alpha). \qquad \text{eqn 2}$$

Whereas the actual power is $$P_{actual}=V*(I*K_i)*\cos\theta. \qquad \text{eqn 3}$$

Where $K_i$ represents a scaling factor for the current transformer and α represents a phase error introduced by the current transformer.

If we focus only on errors introduced by the phase error, then the error can be represented by $$\text{Error}=(P_{actual}-P_{meas})/P_{actual}=1-(\cos(\theta+\alpha)/\cos\theta) \qquad \text{eqn 4}$$

As a result, when the power factor is high (close to unity) the influence of phase error on the measurement is modest or insignificant. However, as the power factor decreases then the influence of the phase error increases significantly.

Figure 4:
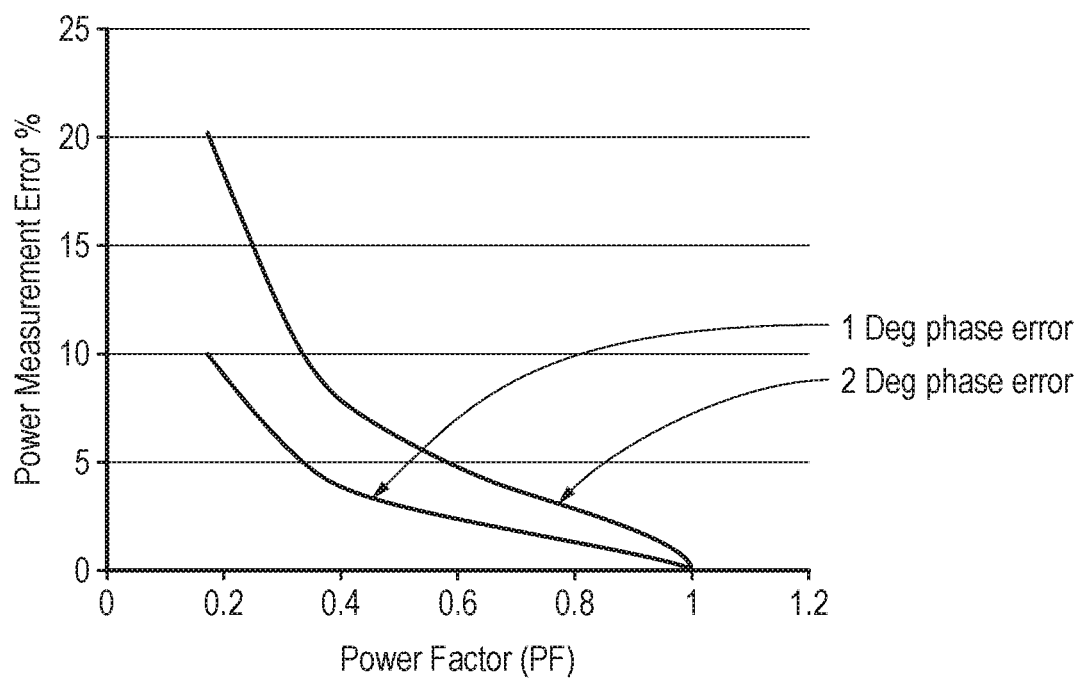
FIG. 4 is a graph showing the percentage error in power measurement for a 1 degree and 2 degree error in estimating the current to voltage phase shift θ for various power factors.

A graph showing the power measurement error as a function of power factor for the one degree phase error and a two degrees phase error is shown in FIG. 4. It can be seen that for power factors of 1 (the voltage and current are in phase) then a 2 degree error in phase measurement is not a problem. However if a load has a power factor of 0.6 (θ=53 degrees) then a 2 degree error in phase measurement manifests as a 5% error in power measurement. It is therefore desirable to accurately characterize the phase error of a current transformer, and indeed also of the signal processing chain associated with the current transformer.

Figure 5:
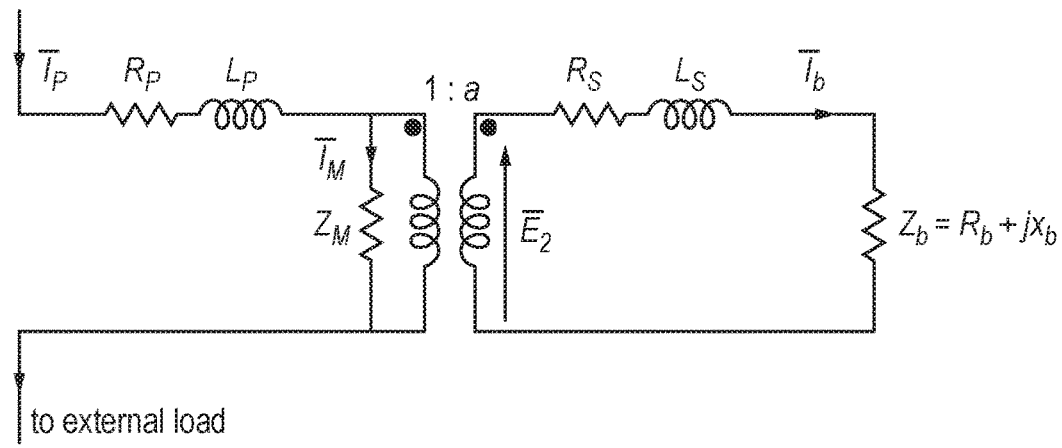
FIG. 5 is an equivalent circuit for the current transformer of FIG. 2.
Figure 6:
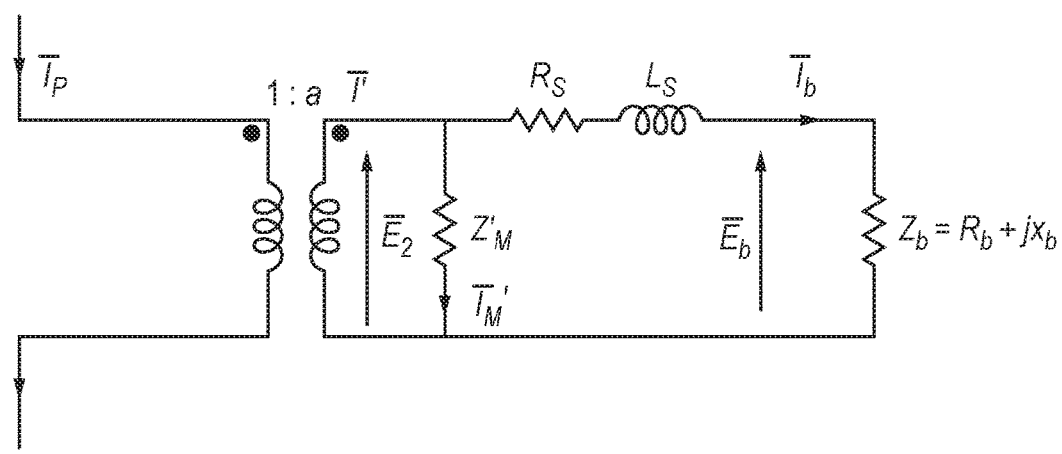
FIG. 6 is a simplified equivalent circuit.

A problem with current transformers is that there response is potentially quite complex. FIG. 5 is an equivalent circuit diagram of a current transformer. The primary winding resistance is designated Rp, the primary winding inductance is Lp, the secondary winding resistance is Rs, the secondary winding inductance is Ls and the burden resistor is Zb. Zm is the magnetizing impedance of the transformer (for example the transformer may have a magnetic core). We can generally ignore Rp and Lp and express the variables that occur on the primary side of the transformer in terms of equivalent quantities as the secondary winding, then the circuit can be represented as show in FIG. 6. I'=Ip/α where α is the transformer ratio; Z'm=Zm/α² and Im'=Im/α. The angle between I' and Ib is the phase error introduced by the current transformer, We can note that I'=I'm+Ib; E2=I'mZ'm; and E2=Ib(Rs+jωLs)+Ib(rb+jωxb) where ω is angular frequency in radians per second. This can be used to give insight into the fact that the phase error changes with the size of the burden resistor. However, it also tells us that the relative sizes of the real and imaginary parts of the impedance also change with frequency. Whilst the mains frequency is generally steady at a known frequency, e.g. 50 Hz, 60 Hz, 400 Hz (aircraft), loads such as inverters can be a source of higher order harmonics which should be taken into account if an accurate assessment of power supplied is to be achieved. The magnetizing impedance can change both with frequency and load current.

It is beneficial to be able to test the response of the current transformer. This could be done by providing a very pure sinusoidal signal as a perturbation to the current through the current transformer and then performing a frequency extraction of that signal (generally by use of Fourier analysis). This requires cost and effort to be expended on the signal source and computational cost to perform an FFT analysis. It would be beneficial to use less expensive signal sources, such as slew rate limited square wave generators. These are simple to produce, for example by use of a digital inverters in a ring, or by toggling a logic gate in response to a counter/timer or a signal from a data processor implementing a numerically controlled square wave oscillator as one of its tasks. The signal need not have a 50-50 mark space ratio and this can further simplify the circuits that generate it. Similarly the slew rate in a voltage or current increasing (pull up) direction does not have to match the slew rate in a voltage or current decreasing (pull down) direction. Other performance limitations will be discussed later.

Figure 7:
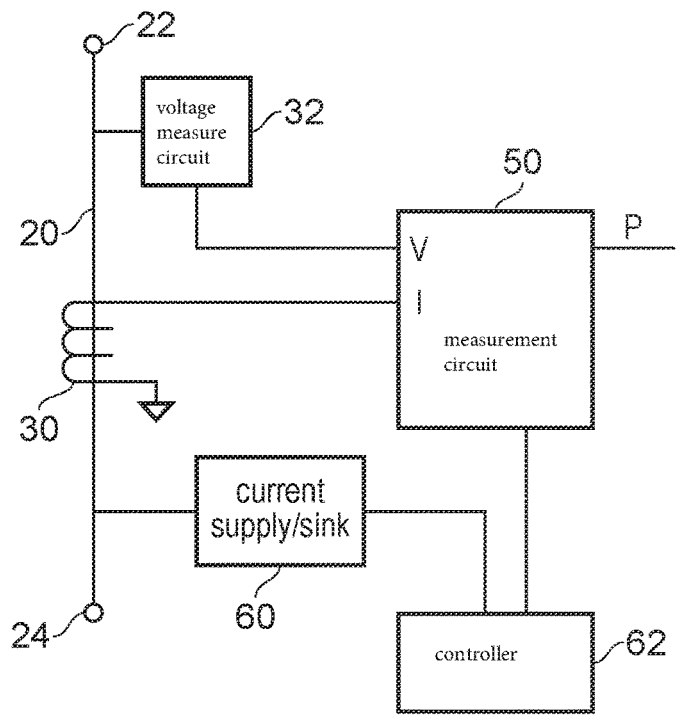
FIG. 7 schematically illustrates first embodiment of the present disclosure.

FIG. 7 schematically illustrates a current measurement apparatus in accordance with a first embodiment of the present disclosure. A conductor 20 enables current flow to occur between a first node 22 and a second node 24. The first node 22 may be connected to an alternating current supply, and the second node 24 may be connected to a load. However in some circumstances the load 24 may both consume energy and may also supply energy. Thus, node 24 might represent a domestic dwelling which generally consumes energy, but would also have photovoltaic panels such that the dwelling can supply energy back to the electrical supply network represented by node 22 when the photovoltaic panels are operational to produce more energy than the dwelling requires. The current passing through the conductor 20 can be measured by a current transformer 30. The current measurement circuit of FIG. 7 may also be in association with a voltage measurement circuit 32 such that the actual power being delivered from node 22 to node 24 can be measured, for example for billing purposes, by a measuring circuit 50.

Watt hour meters used for electrically measurement for billing purposes are typically specified to be accurate to within 0.5% or 1%. It can therefore be seen that even a modest phase error, being less than 1 degree, is unacceptable even for power factors of approximately 0.9. Domestic residences may have a power factor different to unity because of the use of fluorescent lamps, washing machines, induction heating ovens and so forth. Industrial premises are more likely to have large inductive loads but similarly are more likely to have installed power factor correction devices in order to mitigate their energy bills.

Nevertheless, it can be seen that in order to comply with the accuracy standards required of watt hour meters, it is highly desirable to compensate for any phase errors in the current measurement transformer 30. In the arrangement shown in FIG. 7 a current modulation circuit 60 is provided so as to modulate the current drawn from the node 22 in a known manner. The current modulation circuit 60 may be directly connected to the conductor 20 and may periodically switch between drawing a first known current level and a second known current level, one of the levels may be a zero current flow. This switching information is provided to the measurement circuit 50 which is responsive to the output of the current transducer 30 and which can compare the times at which the modulated current 40 changes to observations of that change as made by the current transformer 30 in order to estimate a phase error of the current transformer 30. The timing of the changes in the modulated current may be controlled by a controller 62 which can also supply timing data to the measurement circuit 50. In order to simplify the circuit estimates of phase measurement error may be limited to being performed in one of the voltage half cycles of the mains supply.

Figure 8:
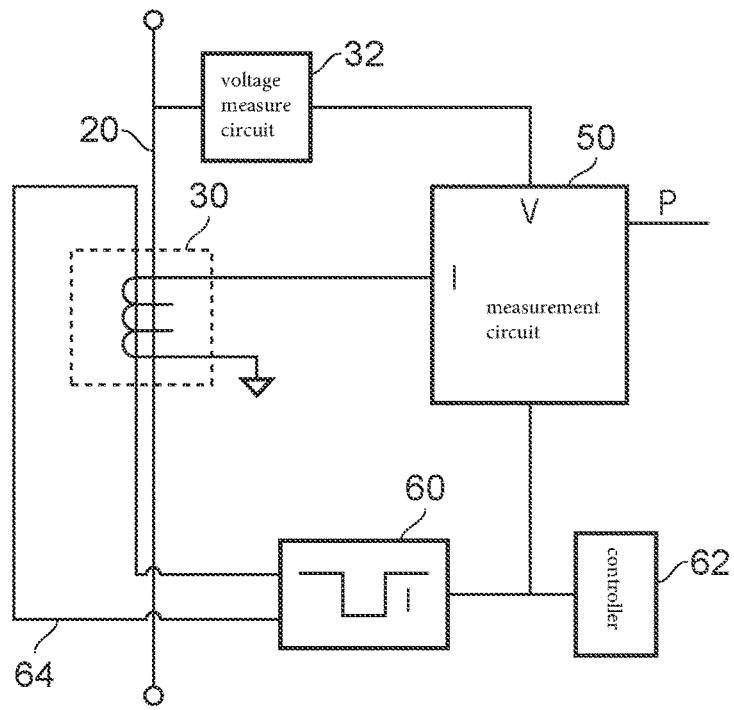
FIG. 8 schematically illustrates a second embodiment of the present disclosure.

FIG. 8 illustrates an alternative arrangement to that shown in FIG. 7 where the current modulation circuit 60 is not directly connected to the conductor 20, but instead drives the modulated current through a further conductor 64 which passes through the current transformer 30 adjacent to the conductor 20. This arrangement ensures galvanic isolation between the conductor 20 and the modulated current driver circuit 60. Otherwise the operation of the circuit is similar to that of the circuit described with respect to FIG. 7.

Figure 9:
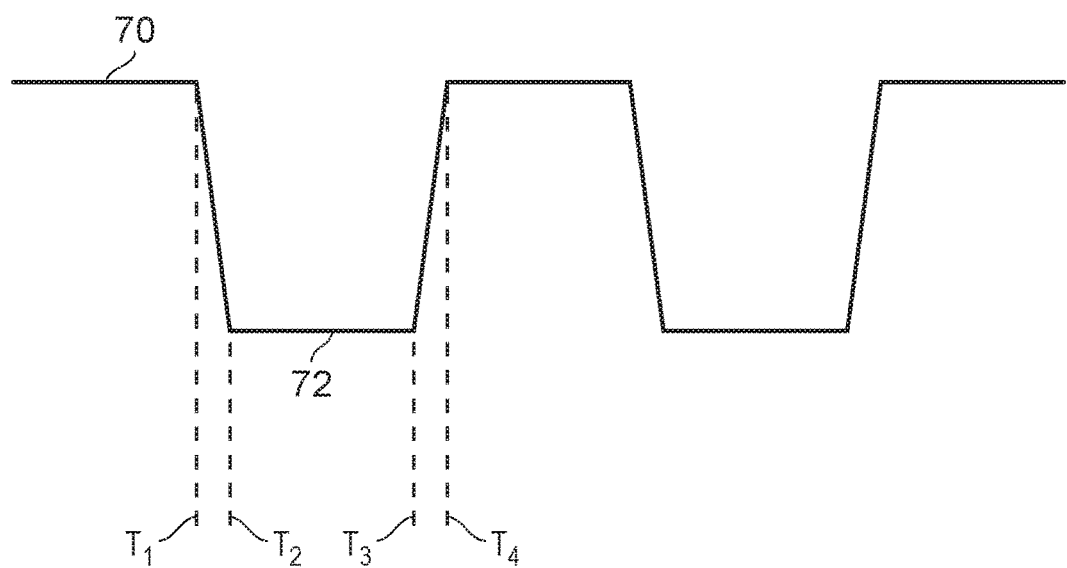
FIG. 9 schematically illustrates the waveform of a drive signal used within embodiments of the present disclosure.

In order to facilitate implementation of a low cost and reliable modulated current drive circuit 60, the modulated current drive circuit 60 provides a square wave current. The square wave current is schematically illustrated in FIG. 9. The square wave current may, for example, be achieved by selectively switching on an off a current source, or by placing a current source in association with a current steering circuit, as will be described later. However, no matter what approach is taken the parasitic capacitive and inductive components associated with the drive circuit 60 and the conductor 20 or conductor 64 will be such that the current does not instantaneously transition between a first value 70 and a second value 72. Instead, when the modulated current drive circuit switches between the first value 70 and the second value 72, then although the switch instruction may result in the current change being initiated at time T1, the current by virtue of being slew rate limited will not reach the second value 72 until time T2. The time difference T2−T1 has a material effect on a subsequent estimation of phase measurement error from the transformer. Similarly, when the square wave transitions from the second value 72 to the first value 70, although the transition may start at time T3, it does not finish until time T4. Additionally if the drive circuit 70 includes an active circuit such as an amplifier, the active circuit/amplifier may have a finite gain bandwidth or slew rate limit that effects the circuit response in a substantive way. The response of the drive circuit 70 may therefore vary as a function of temperature, or may vary over its lifetime or indeed may vary with manufacturing variations. Therefore the actual form of the drive signal may not be accurately known.

The inventors realized that any phase measurements estimated as a result of applying the nominal square wave drive signal to the current in the conductor 20 or flowing in the measurement conductor 62 needs to account for the time taken to transition the square wave between the first value 70 and the second value 72 and any estimates of phase change need to be made with reference to an appropriate value, such as the mid-point of the transition, i.e. ½(T1+T2) and ½(T3+T4), and not the nominal start times T1 and T3. Furthermore, applying this correction means that the performance required of the square wave generator is not so critical so smaller and less power hungry devices can be used.

The duration of the transition, for example from T1 to T2, can be estimated by starting a counter at T1, and stopping the counter when it is determined that the second current value 72 has been reached at time T2. The value of the count held in the counter can then be converted into a time offset and supplied as a corrected transition signal to the measurement circuit 50.

Figure 10:
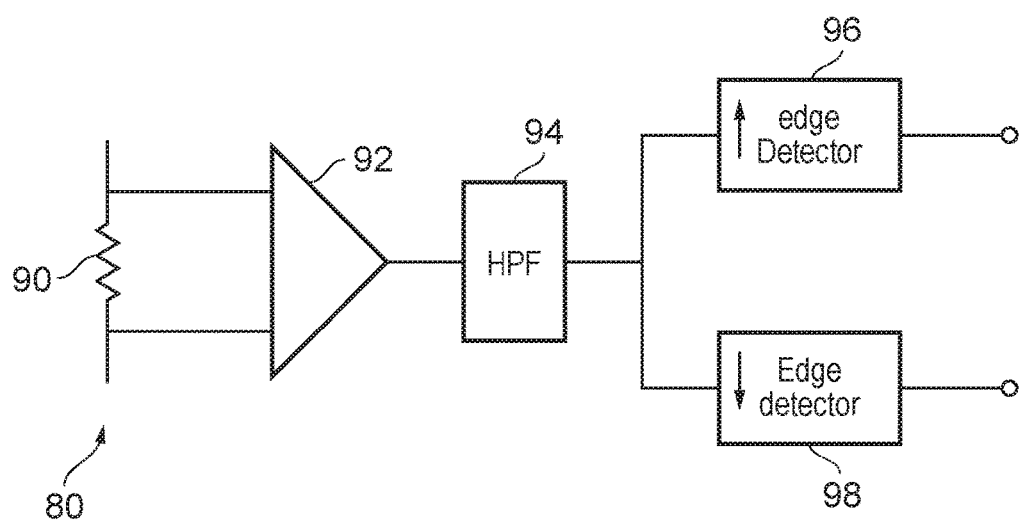
FIG. 10 illustrates one embodiment of a circuit for detecting the time for the square wave to transition between high and low currents.

The correction for slew rate limiting may be performed using an estimation circuit 80 as shown in FIG. 10. The estimation circuit 80 may, for example, include a relatively low value resistor 90 inserted in the current flow path to and from the current modulator circuit 60 so as to measure the modulated current. The voltage developed across the resistor 90 may be DC blocked and amplified by an amplifier having a moderate high pass filter response and then filtered by a further high pass filter 94. The output of the filter 94 selects the edges of the square wave. The voltage can then be detected by rising detector and falling edge detectors 96 and 98 respectively to start and stop a counter timer so as to accurately measure the time for the square wave to transition between its first and second current values, and therefore to accurately estimate the mid-point of the square wave transition and to provide this information to the measurement circuit 50 such that it can correctly account for the phase angle between the voltage and current supplied from node 22 to node 24 in order to correctly identify the amount of energy used by equipment connected to node 24.

Figure 11A:
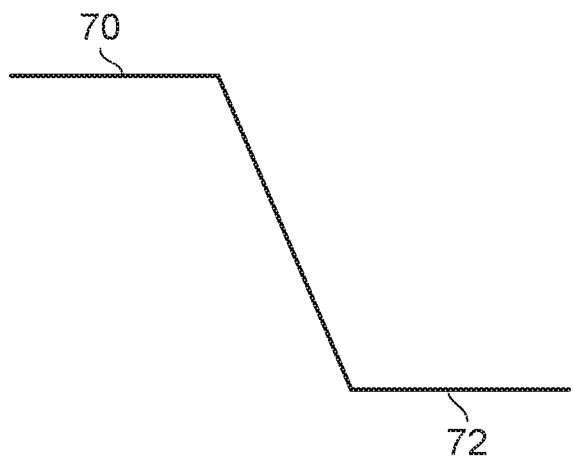
FIGS. 11a to 11c illustrate waveforms within the circuit of FIG. 10.
Figure 11B:
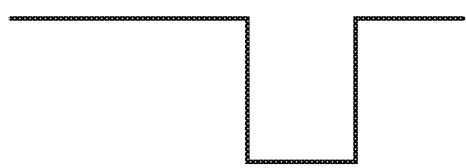
Figure 11C:
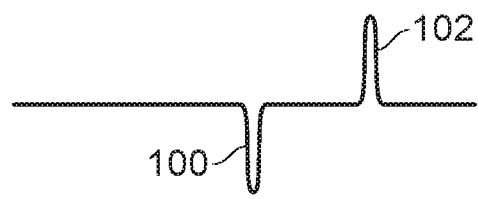

The signals in the circuit of FIG. 10 are shown in shown in greater detail in FIGS. 11a to 11c. FIG. 11a shows the voltage developed across the resistor 90 as the current from the current modulator changes from a relatively high value to a low one. The voltage across the resistor can be high pass filtered to remove the DC component amplified by the amplifier 92 to get a pulse like shape as shown in FIG. 11b. This is then passed though the high pass filter 94 to identify the edges 100 and 102 as shown in FIG. 11c which can detected by the edge detectors 96 and 98 to start and stop a clock. Although this functionality was described in the analog domain, the same result can be achieved by digitizing the voltage across the resistor and analyzing the digital sampled to look for the edges of the current transitions.

Figure 12:
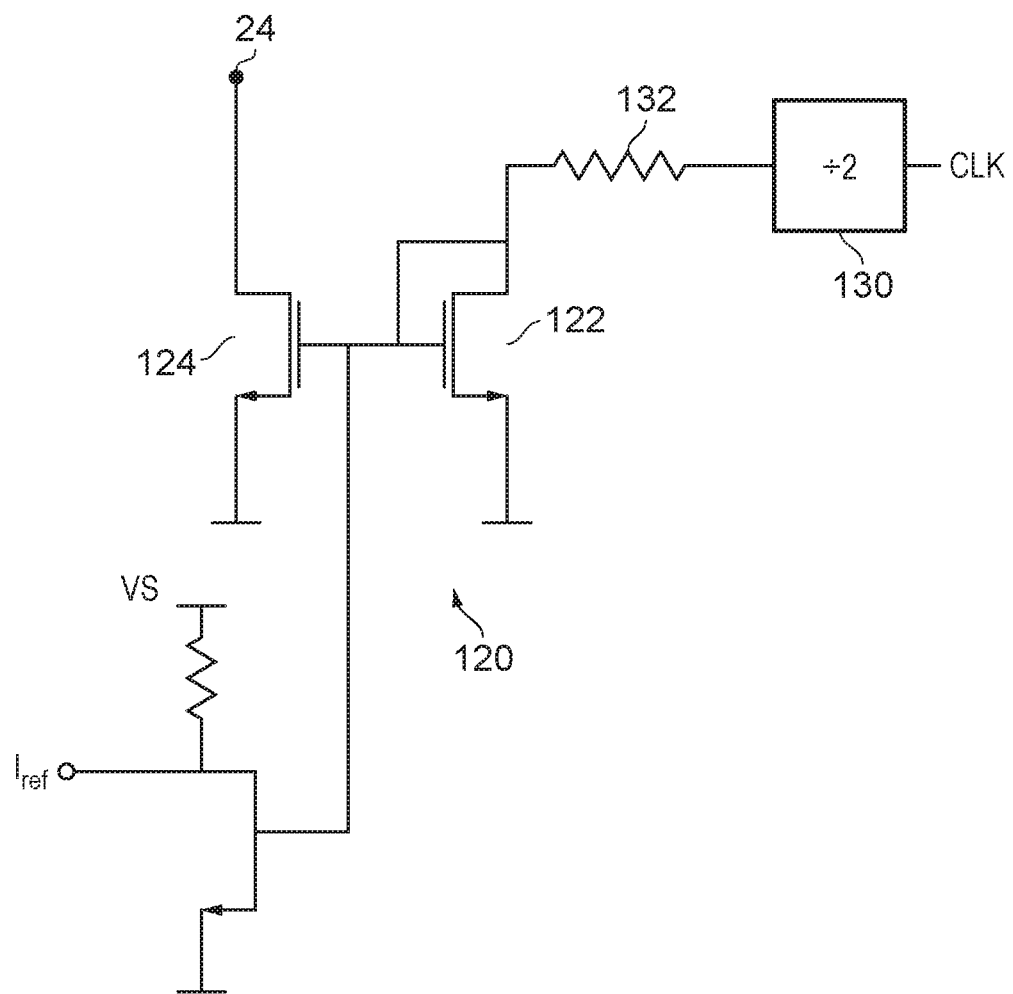
FIG. 12 is a circuit diagram of a current modulator that may be used in an embodiment of this disclosure.

The current flow could be bi-polar (i.e. both positive and negative) or it may be unipolar only. Unipolar is easier to achieve as this can be done by a current mirror as shown in FIG. 12. The current mirror 120 is well known to the person skilled in the art and the current flowing in transistor 122 is copied by transistor 124, subject to a scaling factor to modulate the current in the conductor 20 or 64. The current in transistor 122 can be formed by taking the voltage output of a counter and converting it to a current by passing it through resistor 132. The counter is conveniently a divide by 2 counter as this acts to clean an incoming clock into a square wave having an even mark-space ratio. Alternatively the current mirror could be driven by a digital to analog converter under the control of the controller 62.

Having formed the perturbing current and identified the mid-point of each transition, those mid points can be compared to corresponding changes in the current measured by the current transformer to determine how much phase error the current transformer introduces.

Figure 13:
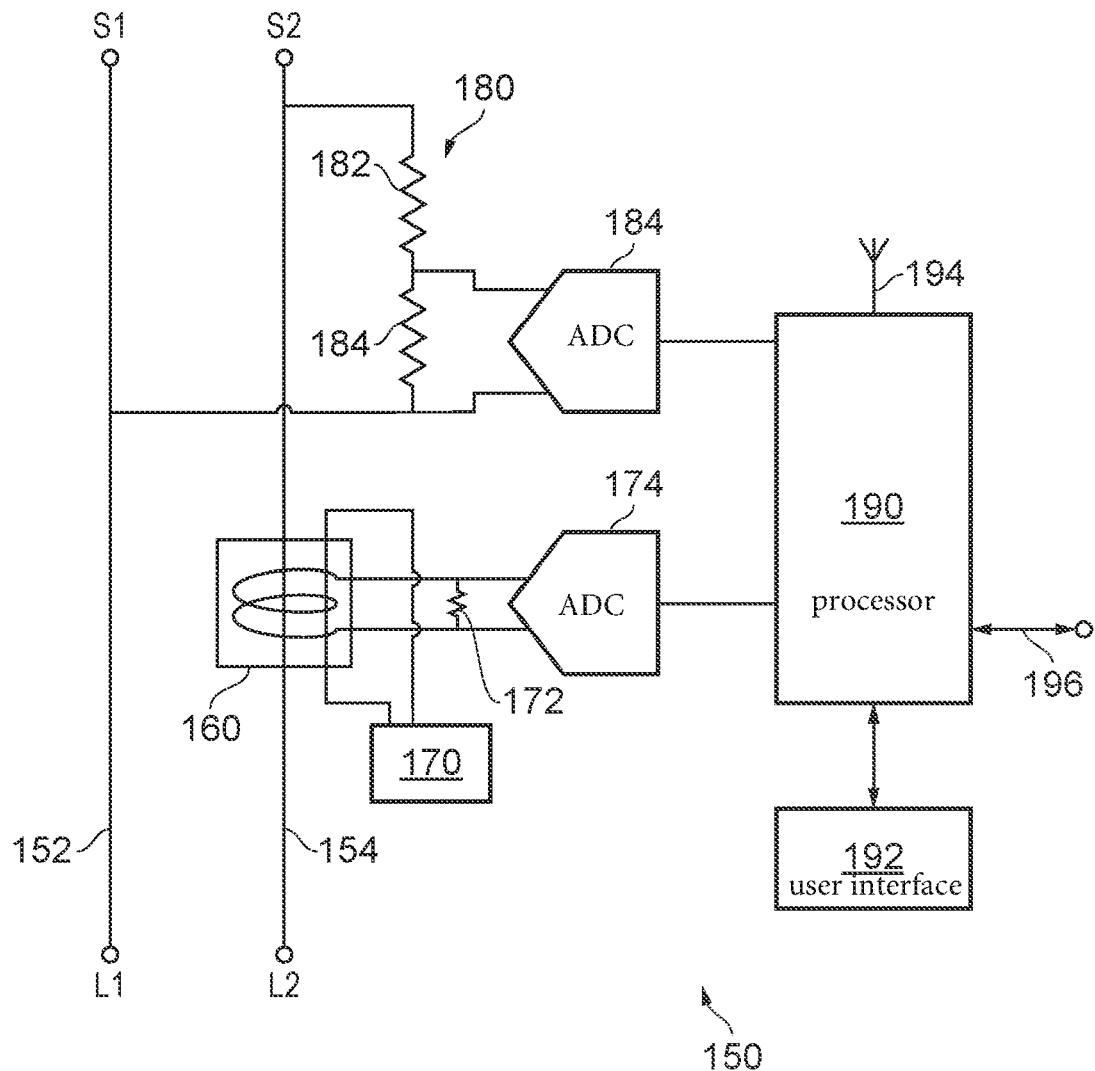
FIG. 13 is a circuit diagram of a Watt-hour meter in accordance with the teachings of this disclosure.

FIG. 13 illustrates a further embodiment of a power meter 150 associated with a first supply conductor 152 which extends between a first supply node S1 and first load node L1. A second supply conductor 152 extends between a second supply node S2 and a second load node L2. The second conductor can be a live conductor is a single phase supply, but the teachings here are extensible to, for example, 3 phase supplies.

A current transformer 160 has a coil that couples with the second supply conductor 164 and also with an excitation current generated by a phase error measurement circuit 170. The current at the output of the current transformer is converted to a voltage by a burden resistor 172 and the voltage across the resistor 122 is digitized by an analog to digital converter 174. The output of the analog to digital converter 174 is a steam of samples $I_S$ where S is an index and S varies as a function of time.

A potential divider formed by a resistors 182 and 184 extends between the conductors 152 and 154 so as to measure the voltage between the conductors. Typically resistor 184 is much smaller than resistor 182. The voltage across the resistor 184 is digitized by an analog to digital converter 184. It will be assumed that the transfer functions on the potential divider is known, but the teachings of WO2014/072733 can be used to determine the transfer function and are incorporated herein by reference. Similarly the transfer characteristic of the current transformer can be assumed to be known, but if it needs to be determined then reader is referred to the teachings of WO2013/038176, the teachings of which are incorporated by reference.

The outputs of the analog to digital converter 184 is a series of samples Vs. Assuming the current samples and voltage samples relate to substantially the same moment in time (i.e. the temporal separation between then is zero or very small compared to the period of the mains waveform), then the power drawn the load can be represented as:

$$P = \frac{1}{N} \sum_{S=1}^{N} I_S V_S \qquad \text{eqn 5}$$

A processor 190 receives the samples $I_s$ and $V_s$ and can process them to, amongst other things, calculate the power being drawn and keep a sum of the energy consumed. The processor can also examine the series of samples to provide other services, such as looking for disturbances, excess loads, evidence of tampering and so on which might be of interest to an energy supplier. The processor may output the result of its calculations by way of a user interface 192 for example in the form of a display, and/or by way of wireless or wired data connections 194 and 196.

It can be seen, when considering a sinusoid that a phase measurement error equates to shifting the sinusoid in time. Thus, in the digital domain for a pure sinusoid the sample value $I_S$ is a displaced version of what it should have been, and if the phase measurement error is known the sample value can be moved by an amount of time that corresponds to the phase measurement error and then used in the calculation of power set out in eqn 5. Where the current signal is a superposition of sinusoids at different frequencies then the designer either has the choice to either just use a single time shift to compensate for the most significant component or to examine the phase error as a function of frequency, and then extract the individual contribution of one or more of the significant frequency components, time shift them back to their correct positions and then calculate the power consumption. If phase angle data is required, the phase angle can be determined by a phase detector circuit, or by use of FFT or Goertzel algorithms. In fact, from reference to the generalized situation of FIG. 1, it can be seen that both the current measurement signal and the voltage measurement signal can be subject to phase shifts. The teachings of this disclosure can be used to apply a correction for phase measurement errors and displacements to both the voltage and current measurements such that they can be brought into correct temporal alignment.

Figure 14:
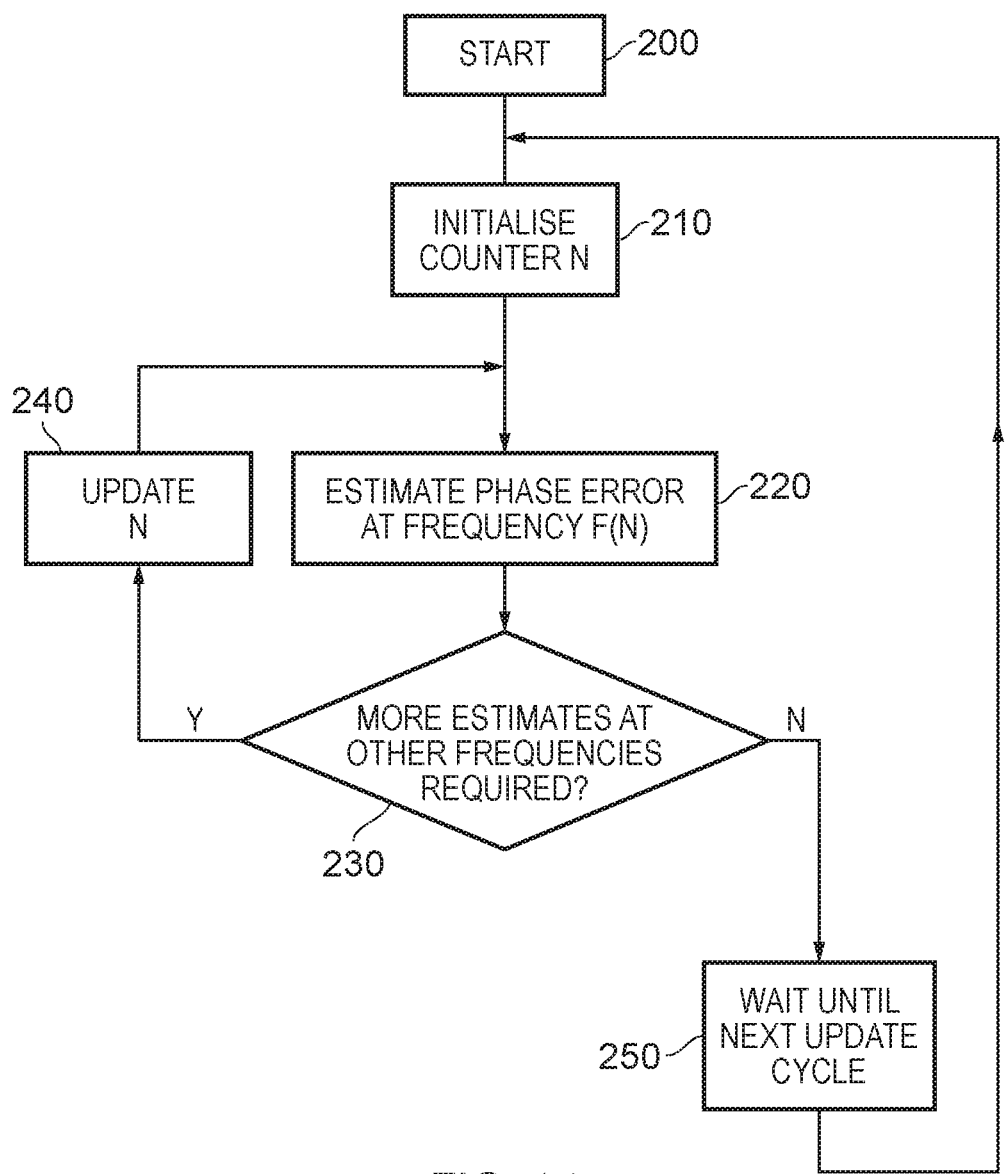
FIG. 14 is a flow diagram of a method of estimating phase measurement error.

The phase error at a particular frequency may be examined by generating a measurement signal from the phase error measurement circuit 170 at that particular frequency in accordance with the teachings set out hereinbefore. FIG. 14 shows a flow chart for characterizing the phase error at multiple frequencies. The process starts at step 200. Control passes to step 210 where a counter/register is initialized to a value N to set the first frequency F(N) to be investigated. From here control is passed to step 220 where the current modulation circuit is arranged to supply a modulated current at frequency F(N) such that the result of such modulation can be captured in the output sequence from the analog to digital converter 174. Control passes to step 230 where a test is made to see if the phase measurement error needs to be determined at other frequencies. If yes then control is passed to step 240 where the value N is changed to represent another frequency and control returned to step 220 such that the phase measurement error is determined at another frequency. If step 230 determines that another measurement of phase error is not required control is passed to step 250 which waits until another update of phase measurement error is scheduled before passing control back to step 210.

Figure 15:
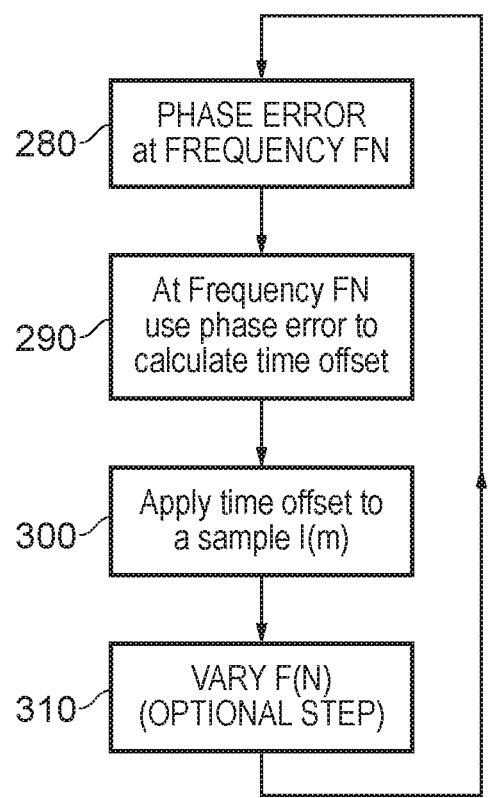
FIG. 15 is a flow diagram of a method of correcting for phase measurement error.

The estimates of phase measure error may be used to correct phase measurements immediately or stored for later use. FIG. 15 is a flow chart illustrating how the phase measurement errors may be used. Step 280 obtains a phase measurement error at step 280, for example from a value stored in memory as a result of executing the flow chart shown in FIG. 13, and at step 290 used this to calculate a time correction that is used to move the signal $I_S$ from S=TR, where T is time from an arbitrary system time at which S=0 and R is the sample rate to $I_S'=I_S+(\varphi R/(360F))$ where $I_S'$ is a corrected sample number of the sample $I_S$, $\varphi$ is the phase measurement error is degrees, R is the sample rate and F is the frequency of the signal or signal component to which the correction is being applied. The correction is applied at step 300. From step 300 phase measurement error correction may optionally be performed at other frequencies by setting a new frequency at step 310 and then returning the process sequence to step 280.

Hitherto it has been assumed that the slew rate limited transitions are linear, but this need not be the case. Various distortions can affect the shape of an ideal square wave, an example of which is shown in FIG. 16a.

Figure 16:
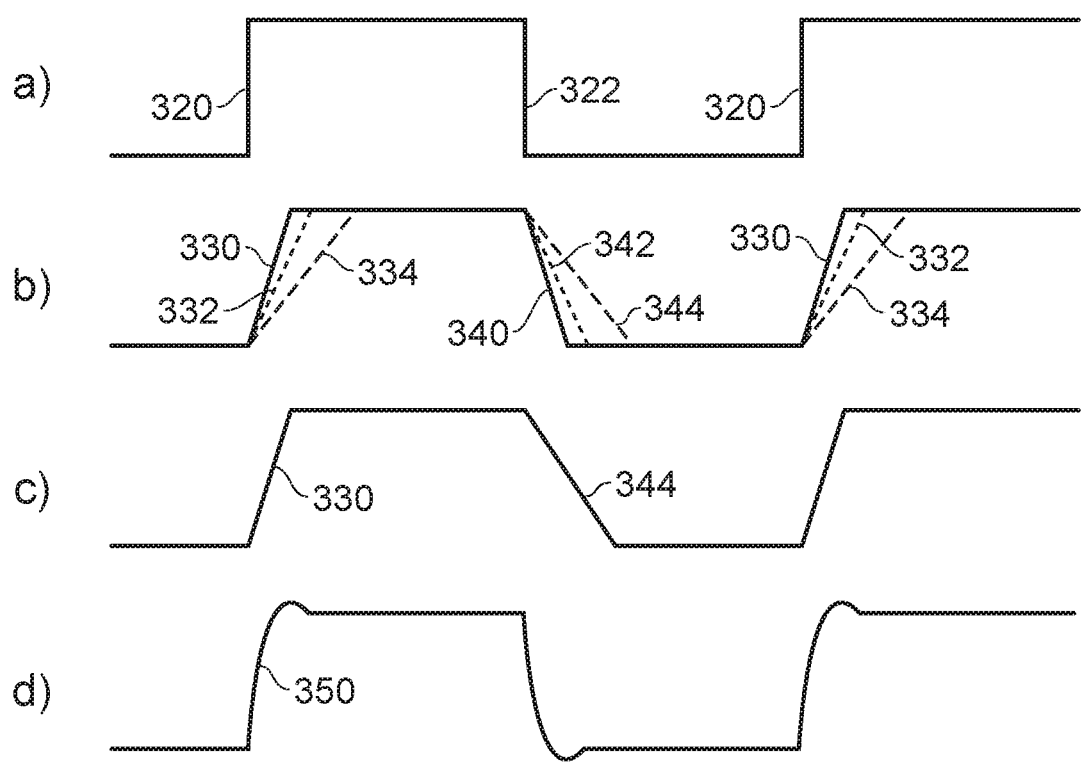
FIGS. 16a to 16d show how the ideal square-wave waveform may become distorted.

A first form of distortion which has already been considered is slew rate limiting, where the ideal instantaneous rising and falling transitions 320 and 322 of FIG. 16a are delivered as slower transitions. FIG. 16b shows example shapes of slew-rate limited square waves where the rising edge is represented by waveforms 330, 332 and 334 which exhibit fast, medium and slow slew rates, respectively. Similarly the falling edge is represented by relatively fast transition 340, a medium speed transition 342 and a relatively slow transition 344.

There is no reason to assume that the slew rates for the rising and falling transitions will be the same. Thus the square wave like input waveform may have an asymmetric slew rate limited form as shown in FIG. 16c.

Slew rate limiting is not the only form of distortion which could affect the input waveform. The on-resistance of transistors may combine with parasitic capacitance to give rise to rising and falling edges that asymptote towards their target value as shown by transition 350 in FIG. 16d, in the style of charging or discharging a capacitor via a resistor. Similarly parasitic inductance may interact with the parasitic capacitance to introduce overshoot, also shown in FIG. 16d.

The techniques disclosed herein can be used to estimate a corrected effective rising edge and falling edge time for the square wave, with the timings to be set to, for example, a 50% of the voltage transition threshold. However other values can also be selected.

As noted with respect to FIG. 1, components such as the anti-aliasing filter the ADC and the programmable gain amplifier can introduce delay. This observation can be further generalized as shown in FIG. 17.

Figure 17:
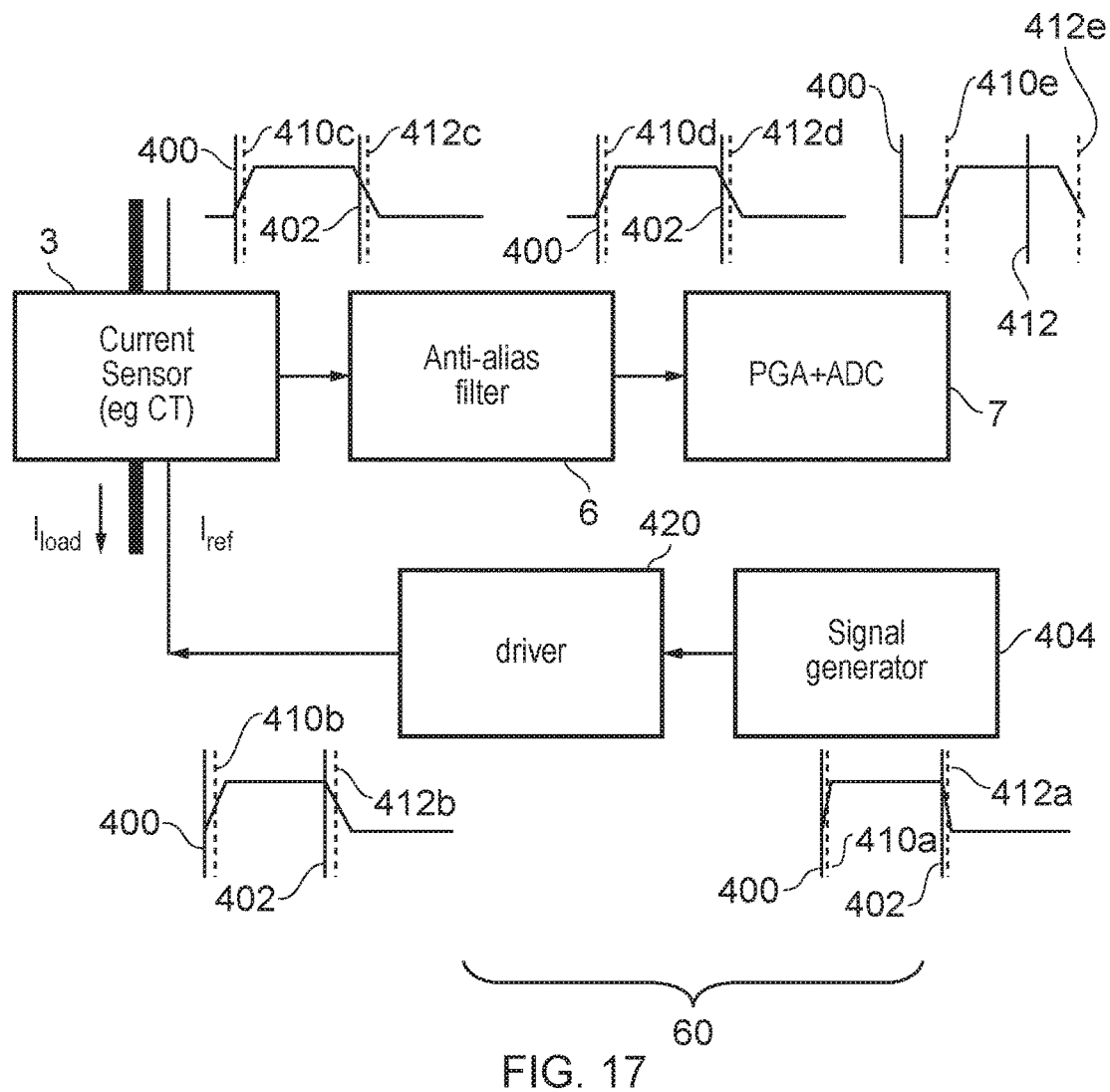
FIG. 17 is a schematic diagram of a measurement system to indicate how delays may build up.

In FIG. 17 a rising edge transition is instructed by a digital instruction at time 400 and a falling edge transition is instructed at time 402. These instructions are provided to the signal generator 404. The signal generator may be a simple logic circuit, such as a D type flip flop with its Qbar output connected to its data input, or it could be more complex, such as a DAC. However, the signal generator can be assumed to introduce some delay and have a limited transition speed such that the effective transitions should be placed at new times 410a and 412a. The output from the signal generator passes through a driver 420 which adds further delay and/or slew rate and bandwidth limitation such that the effective transitions should now be placed at times 410h and 412b. The current sensor 3 adds a further delay such that the effective transitions as measured are now at times 410c and 412c. By the time the signal has passed through the filter 6 the effective transitions have moved to times 410d and 412d. By the time the digitization on the ADC 7 has been completed the effective transitions have become delayed to times 410e and 412e.

The relative amounts of each additional delay are deliberately not drawn to scale. It should simply be noted then in the current signal path and the voltage signal path each input signal used for measurement purposes can be subject to the sum of the delays, and that correction may need to be applied to the voltage and the current measurement channels.

As noted before, the signal generator could be a DAC, and hence the input signal can be given any desired shape and since the shape of the input signal is known the same shape can be looked for in the output of the ADC 7 to acquire an estimate of propagation delay. Thus the DAC could be driven to generate classical waveforms such as square waves, step wise approximations of triangle waves, step wise approximates of sinusoids and so on.

In an alternative approach the DAC could also generate random or pseudo-random test sequences which would look like noise but which could still be recovered from the output of the ADC 7 so as to allow a delay to be estimated. Auto-correlation techniques can be used to achieve this as they are computationally robust and reasonably easy to perform. This would characterize the time delay though the system, which could then be converted to a phase delay for a given frequency.

The arrangement of FIG. 17 where the signal generator 404 is a DAC also allows for the possibility of using the DAC to generate a known approximation to a slew rate limited square wave. However now the transition rate of the rising and falling edges can be determined by the digital circuit driving the DAC and these rates can be chosen to be comfortably within the bandwidth and slew rate capabilities of the buffer/driver 420. Now the time correction discussed herein before with respect to FIG. 9 can be provided as a preset number based on the effective transition time, e.g. from T1 to T2 as defined by the control word sequence supplied to the DAC. A similar deterministic as opposed to measurement based approach can be used for other signal profiles where the characteristics of the signal output by the DAC in terms of speed of voltage transitions are selected such that they do not approach the limits of fidelity of downstream driver circuitry called upon to introduce the input signal into the measure apparatus.

Figure 18:
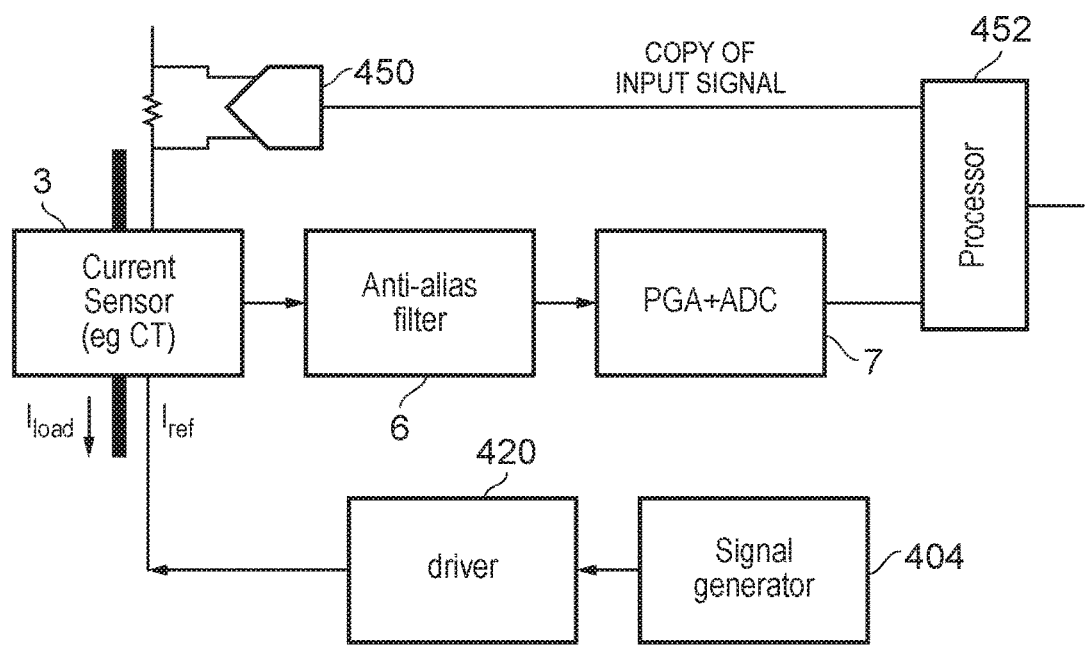
FIG. 18 is a schematic diagram of a further embodiment of this disclosure.

However, such an observation can be further extended as shown in FIG. 18.

Here a signal may be generated from a signal source that we do not control in a deterministic manner. The signal could be from a low quality (including an exceptionally low quality) oscillator and driver, a filtered noise source or a random number generator driving a DAC. However a copy of the reference/input current is digitized by an analog to digital converter 450, which may be a separate device or could be provided by the ADC 7 operating in a time multiplexed manner, and the digitized input signal used to characterize the response of the current transducer and the output from the current transducer can then be compared, and cross-correlated to find the delay. Using the ADC 7 in a time multiplexed manner to acquire a copy of the input signal can be advantageous and the delay introduced by the filter 6 and PGA/ADC 7 can be made common to both signal chains, thereby effectively mitigating the effects of these delays.

In the embodiments described with respect to FIGS. 7 and 8 a controller 60 provided a timing signal to the power meter 50. However the power meter 50 may also be connected to an optional second current sink to provide a signal Iref as shown in FIG. 12 that tracks accurately with when the transistor 124 switches, thereby providing a direct measurement of the start of a transition.

The circuit can be used on a single phase as shown in the Figures or on split phase systems such as those in the USA or Japan, or on 3 phase systems as commonly found in large installations. In 3 phase systems 3 current transformers would be used, one for each of the phases and a neutral point may be connected to a return line to account for phase imbalance.

The circuit can be used in many applications where measurement of AC signals are desired, and can be used in domestic, industrial, aeronautical and medical fields (this is not a limiting list). The apparatus and method described herein can be used "in situ" but can also be used by component manufacturers and installers to perform testing can calibration during manufacture and/or installation of transducers and meters. The meter may include communication capability (as this is becoming commonplace) to enable it to report on power consumption. This capability may be leveraged to report the phase error as well for network monitoring purposes, to identify uncompensated loads or to monitor the performance of the meters to enable faults or degradation in performance to be identified and scheduled for rectification and/or compensation or correction to be applied to a customer's bill to avoid overcharging and hence intervention by a regulatory authority pending repair or replacement of the meter and/or current transducer either alone or in combination.

The claims presented herein are in single dependency format suitable for filing at the USPTO, but it is to be appreciated that any claim may (and is expected to) depend on any preceding claim of the same type unless that is clearly technically infeasible.

The invention claimed is:

1. A method of improving power measurement accuracy based on an estimated phase measurement error resulting from a current transducer, the method comprising:
   providing, to an input of a current transducer, an input signal having a first delay resulting from input signal generator circuitry;
   receiving, from the current transducer, an output signal having a second delay resulting from the current transducer,
   analyzing the output signal to determine a phase difference compared to the input signal based on the first and second delays resulting from the input signal generator circuitry and the current transducer, respectively; and
   estimating a phase measurement error, resulting at least in part from the current transducer, from the phase difference determined based on the first and second delays.

2. A method as claimed in claim 1, wherein the input signal generator circuitry is configured to generate a repeating signal as the input signal.

3. A method as claimed in claim 1, wherein the signal generator circuitry is configured to generate a stepwise approximation to a continuous signal as the input signal.

4. A method as claimed in claim 1, wherein the input signal generator circuitry is configured to generate at least one of a sinusoid, a triangle wave, a square wave with smoothed transitions, and a bandwidth limited noise source as the input signal.

5. A method as claimed in claim 1, wherein the input signal generator circuitry is configured to generate a square wave like signal as the input signal, and wherein the first delay results from edges of the square wave like signal transitioning between high and low values.

6. A method as claimed in claim 2, in which the current transducer comprises a current transformer, and the repeating signal approximates a slew rate limited square wave or a charge rate limited square wave.

7. A method as claimed in claim 6, in which the slew rate or charge rate limited square wave transitions between first and second values, and where the first delay corresponds to a time to reach a midpoint between a transition from the first value to the second value.

8. A method as claimed in claim 7, further comprising determining the midpoint by starting a counter or timer at the beginning of the transition from the first value to the second value and stopping the counter or timer at the end of the transition.

9. A method as claimed in claim 7, further comprising adding a second phase correction to account for non-linearly of the rate of transition between the first and second values.

10. A method as claimed in claim 9, in which the second correction is estimated or measured at manufacture and stored in memory.

11. A method as claimed in claim 1, in which the transducer is a current transformer and the phase difference after applying a correction signal represents a phase shift resulting from the current transformer.

12. A method of estimating power consumption comprising measuring the potential at a first conductor, measuring the current flowing in the first conductor, applying a phase correction to the measurement of current using the method of claim 1, and multiplying the potential and current measurements to estimate power.

13. A method as claimed in claim 12, in which the correction to the measured current comprises estimating and applying a time shift to be applied to sampled values of the current compared to sampled values of voltage.

14. A method as claimed in claim 6 in which the slew rate or charge rate limited square wave has a substantially equal mark-space ratio.

15. A method as claimed in claim 1 in which the phase difference is estimated using a FFT or a Geortzel algorithm, or a phase detector circuit.

16. A method as claimed in claim 1 in which the input signal has a predetermined slew rate or transition time and is formed by a digital to analog converter and a correction required to account for the finite rate of change of the input signal is known because the slew rate or transition time of the input signal is predetermined.

17. The method of claim 1 further comprising computing power by applying a correction to the estimate of phase measurement error to compensate for a finite rate of change of the input signal based on the determined phase difference including compensation for the first and second delays.

18. The method of claim 1 further comprising storing or outputting the phase difference for monitoring performance of a power meter.

19. The method of claim 1, wherein the phase difference is further determined based on a third delay resulting from at least one of a current sensor, a filter, or an analog to digital converter.

20. The method of claim 1 function comprising converting, using an analog to digital converter, the determined phase difference from analog to digital form for further processing.

21. An apparatus of estimating phase shifts in measurements of current, the apparatus comprising:
a current transducer for receiving, from input signal generator circuitry, an input signal having a first delay resulting from the input signal generator circuitry; and
a phase or time shift comparator for:
receiving, from the current transducer, an output signal having a second delay resulting from the current transducer; and
analyzing the output signal to deter mine a phase or time difference compared to the input signal based on the first and second delays resulting from the input signal generator circuitry and the current transducer, respectively,
wherein the phase or time shift comparator is arranged to estimate the phase shift based on the phase difference determined based on the first and second delays.

22. An apparatus as claimed in claim 21, in which the input signal is an approximation to a square wave but having ramp like transitions, the input signal is formed by a digital to analog converter such that the duration of the ramp like transitions are known or predetermined, and a correction value to account for the duration of the ramp like transition is known or predetermined.

23. A power meter including an apparatus as claimed in claim 21.

24. A power meter as claimed in claim 23 further including an interface for sending data back to a network operator, where the data includes estimates of performance of the power meter and/or information about load and voltage conditions at the power meter.

25. A power meter as claimed in claim 23 further arranged to account for harmonic signals in the current when calculating the power drawn.

26. A power meter as claimed in claim 23 in which the signal generator circuitry generates a repeating signal having the fundamental frequency and the frequency of the signal generator circuitry is adjustable.

27. An apparatus as claimed in claim 21 further comprising a circuit for measuring the transition time in the input signal corresponding to the first delay.

28. An apparatus as claimed in claim 21, in which the input signal generator circuitry is a square wave generator.

29. An apparatus as claimed in claim 28 further comprising a measurement circuit configured to estimate the first delay based on a midpoint of a square wave transition and provide a timing signal to the phase or time shift comparator as the first delay.

30. The apparatus of claim 21 further comprising an analog to digital converter configured to convert the determined phase difference from analog to digital form for further processing.

31. The apparatus of claim 21, wherein the phase difference is further determined based on a third delay resulting from at least one of a current sensor, a filter, or an analog to digital converter.

32. The apparatus of claim 21 further comprising circuitry for applying a phase correction to compensate for a finite rate of change of the input signal based on the determined phase or time difference including compensation for the first and second delays to enable power computation.

33. The apparatus of claim 21 further comprising circuitry for storing or outputting the phase difference for monitoring performance of a power meter.

34. The apparatus of claim 21 further comprising a counter or timer circuit, wherein the input signal comprises a periodic signal having a slew rate or charge rate that transitions between first and second values, and where the first delay is computed by the counter or timer circuit based on a time to reach a midpoint between a transition from the first value to the second value, wherein the midpoint is determined by starting the counter or timer circuit at the beginning of the transition from the first value to the second value and stopping the counter or timer circuit at the end of the transition.

35. A method of estimating a phase measurement error in measurement of current, the method comprising:
providing a repeating input signal to an input of a current transformer, where the repeating signal has nominally linear rising and falling edges, and wherein the input signal has a first delay resulting from input signal generator circuitry;
receiving, from the current transducer, an output signal having a second delay resulting from the current transducer;
analyzing the output signal to determine a phase difference compared to the input signal based on the first and second delays resulting from the input signal generator circuitry and the current transducer, respectively; and
estimating a phase measurement error from the phase difference determined based on the first and second delays.

36. The method of claim 35 further comprising computing power by applying a correction to the estimate of phase measurement error to compensate for a finite rate of change of the edges of the input signal, and the fundamental frequency of the input signal is adjustable to enable estimation of phase measurement error at one or more frequencies based on the determined phase difference including compensation for the first and second delays.

* * * * *

UNITED STATES PATENT AND TRADEMARK OFFICE
CERTIFICATE OF CORRECTION

PATENT NO. : 10,132,846 B2  
APPLICATION NO. : 15/182094  
DATED : November 20, 2018  
INVENTOR(S) : Hurwitz et al.

Page 1 of 1

It is certified that error appears in the above-identified patent and that said Letters Patent is hereby corrected as shown below:

On the Title Page

On page 2, in Column 2, item (56), under "Other Publications", Line 9, delete "PC1782016/001992," and insert --PCT/IB2016/001992,-- therefor In the Claims In Column 15, Line 9, in Claim 15, delete "Geortzel" and insert --Goertzel-- therefor In Column 15, Line 30, in Claim 20, delete "function" and insert --further-- therefor In Column 15, Line 34, in Claim 21, after "estimating", insert --a--

In Column 15, Line 34, in Claim 21, delete "shifts" and insert --shift-- therefor In Column 15, Lines 34-35, in Claim 21, delete "measurements" and insert --measurement-- therefor In Column 15, Line 43, in Claim 21, delete "deter mine" and insert --determine-- therefor Signed and Sealed this  
Twenty-first Day of April, 2020

Andrei Iancu  
*Director of the United States Patent and Trademark Office*